United States Patent [19]

Chalco et al.

[11] Patent Number: 5,289,632
[45] Date of Patent: Mar. 1, 1994

[54] APPLYING CONDUCTIVE LINES TO INTEGRATED CIRCUITS

[75] Inventors: Pedro A. Chalco, Yorktown; Matthew F. Cali, Harriman; Laertis Economikos, Wappingers Falls; James L. Speidell, Poughquag, all of N.Y.

[73] Assignee: International Business Machines Corporation, Armonk, N.Y.

[21] Appl. No.: 981,458

[22] Filed: Nov. 25, 1992

[51] Int. Cl.⁵ .............................................. H05K 3/02
[52] U.S. Cl. .................................. 29/846; 29/402.16; 29/829; 156/234; 174/261
[58] Field of Search ............... 29/829, 402.16, 846; 156/234, 233, 235

[56] References Cited

U.S. PATENT DOCUMENTS

| | | | |
|---|---|---|---|
| 3,614,832 | 10/1971 | Chance | 29/626 |
| 4,418,264 | 11/1983 | Thorwarth | 29/402.16 X |
| 4,588,468 | 5/1986 | McGinty | 29/829 X |
| 4,630,355 | 12/1986 | Johnson | 29/829 X |
| 4,704,304 | 11/1987 | Amendola | 427/57 |
| 4,859,263 | 8/1989 | Dziurla et al. | 156/234 X |
| 4,902,364 | 2/1990 | Parker et al. | 156/234 X |
| 4,908,938 | 3/1990 | Thorwarth et al. | 29/402.16 X |
| 4,970,365 | 11/1990 | Chalco | 219/121.6 |
| 5,079,070 | 1/1992 | Chalco | 428/209 |

FOREIGN PATENT DOCUMENTS 2213999  8/1989  United Kingdom ............ 29/402.16

Primary Examiner—Carl J. Arbes
Attorney, Agent, or Firm—Richard Lau

[57] ABSTRACT

A conductive line is applied to a substrate by aligning the conductive line in juxtaposition with a selected area of the substrate; bonding the conductive line to the substrate; and detaching the conductive line from a carrier in which the conductive line is suspended. The carrier has a carrier opening defined by sidewalls, and conductive material is suspended by the sidewalls of the carrier opening so as to be embedded within the carrier opening, and form the conductive line.

27 Claims, 5 Drawing Sheets

APPLYING CONDUCTIVE LINES TO INTEGRATED CIRCUITS

TECHNICAL FIELD

The present invention relates generally to integrated circuits and, more particularly, to applying conductive lines to desired areas of integrated circuits.

BACKGROUND OF THE INVENTION

Conventionally, repairing of open circuit defects in the fine lines of high density circuitry, such as thin film conductor lines, is accomplished by closing or bridging the open defect with conductive material. Two main techniques generally used are laser chemical vapor deposition (LCVD) and wire bonding. Laser chemical vapor deposition involves bridging the open defect in the line by depositing conductive material, such as gold, across the open defect. The conductive material is typically deposited from an organometallic gas precursor. Major disadvantages associated with using LCVD for open defects repair include difficulty in controlling the dimensions, particularly, the height, of the conductive material being deposited, poor adhesion of the conductive material, and inadequate deposition control which results in depositing of conductive material in unwanted areas of the circuit being repaired.

As described in commonly assigned U.S. Pat. No. 5,079,070, issued Jan. 7, 1992, to Chalco et al., and shown in FIG. 1, FIGS. 2A-B and FIGS. 3A-B each labelled as "Prior Art", open defects repair using wire bonding generally involves a bonding tip 10 and a support sheet 20 onto which one or more repair lines 15 has been etched. The bonding tip 10 has an internal cylindrical cavity 12 which ends in a conical shape at its frontal surface 14; and the diameter of the cylindrical cavity 12 tapers down to a cylindrical opening 17 in the frontal surface 14.

The support sheet 20 is fabricated by blanket metallizing or laminating of a metal layer onto a support material. The metal layer and support material are circuitized by photoprocesses and etching procedures for forming the repair lines 15. The metal layer is then selectively etched for forming a window opening 25 therethrough for exposing the repair line 15 for performing the repair. As shown, the repair lines 15 are mechanically supported on the bottom surface 30 of the support sheet 20.

The repair process includes positioning one of the repair lines 15 over an open defect 35 of a circuit line 40. In accordance with commonly assigned U.S. Pat. No. 4,970,365, to Chalco, incorporated herein by reference, ultrasonic vibratory motion and laser energy are then utilized to enable the bonding tip 10 to bond the repair line 15 to the circuit line 40. After bonding, the support sheet 20 is lifted using a "peeling action" to detach or fracture the repair line 15 so as to complete the repair. Although the '070 patent describes this peeling action as a method to test for good repairs, it has been found that the force required for detaching the repair line 15 from the support sheet 20 may cause damage to the repair line 15, further damage to the circuit line 40 being repaired, or weakening or fracturing of the bond between the repair line 15 and the circuit line 40. This is particularly true in the case of the extremely fragile and delicate fine lines used in present day state-of-the-art high density circuitry.

Further, it has been found to be exceedingly difficult to fabricate a support sheet with repair lines having very small dimensions. For instance, it has been problematic to fabricate repair lines having a height on the order of 1-10 microns, as is oftentimes required in present day technology. In this regard, repair lines which are excessive in height may result in undesirable protrusion of the repair line above the plane of the circuit line being repaired.

SUMMARY OF THE INVENTION

It is therefore an object of the present invention to improve repairing of open circuit defects.

It is another object of the present invention to generally improve application of conductive lines to integrated circuits.

In order to accomplish the above and other objects of the present invention, there is provided a method of applying a conductive line to a substrate, which comprises the steps of aligning a conductive line in juxtaposition with a selected area of a substrate; bonding the conductive line to the substrate and detaching the conductive line from a carrier in which the conductive line is suspended.

The carrier has a carrier opening defined by sidewalls, and conductive material is suspended by the sidewalls of the carrier opening so as to be embedded within the carrier opening, and form the conductive line.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENT

Although one specific use of the present invention is repairing of open circuit defects, it should be fully understood and appreciated that use of the present invention is contemplated for any situation in which a circuit requires a conductive line to be added thereto or joined as a part thereof. For example, in addition to repairing circuits, a conductive line in accordance with the invention can be used for adding a connection to a circuit that was either inadvertently omitted, or previously unnecessary or undesired. Accordingly, those skilled in the art will appreciate that the present invention is useful whenever and wherever a conductive line is required to be applied to a circuit.

Referring to FIGS. 4A–F, there is shown a selected area 50 of an integrated circuit over which a conductive line is to be applied. Illustratively, the invention is shown and described for connecting together two ends of a metallization or circuit line 55. As an example, the selected area 50 may be an open circuit defect and the circuit line 55 may be a thin film line.

The area 50 and circuit line 55 may be sandwiched between an insulating layer 60 and a circuit base 65. The insulating layer 60 is typically an insulating material such as polyimide; and the circuit base 65 may comprise a substrate, such as a multilayered ceramic substrate or a printed circuit board. In order to apply a conductive line to the area 50, the insulating layer 60 must be opened, preferably locally, so as to expose a portion of the circuit line 55, which includes the area 50. The opening created in the insulating layer 60 should have dimensions adequate to accommodate at least a portion of the conductive line grid as described hereinbelow. The opening in the insulating layer 60 can be created by any appropriate technique. For example, an opening can be created in a polyimide insulating layer by ablation with a pulsed excimer laser, such laser being equipped with helium jets to remove debris generated during the ablation. The insulating layer 60, or a portion thereof, is thus removed.

Figure 1:
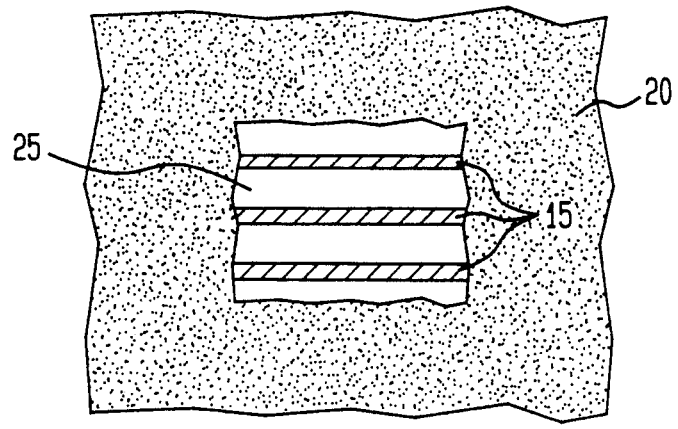
FIG. 1 shows a prior art support sheet.
Figure 2A:
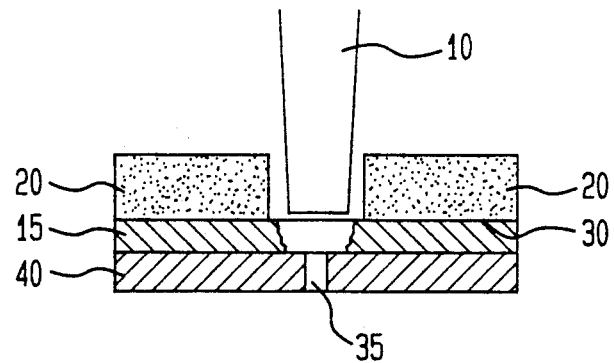
FIGS. 2A-B illustrate prior art bonding using the support sheet of FIG. 1.
Figure 2B:
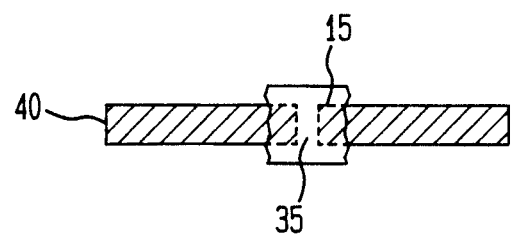
Figure 3A:
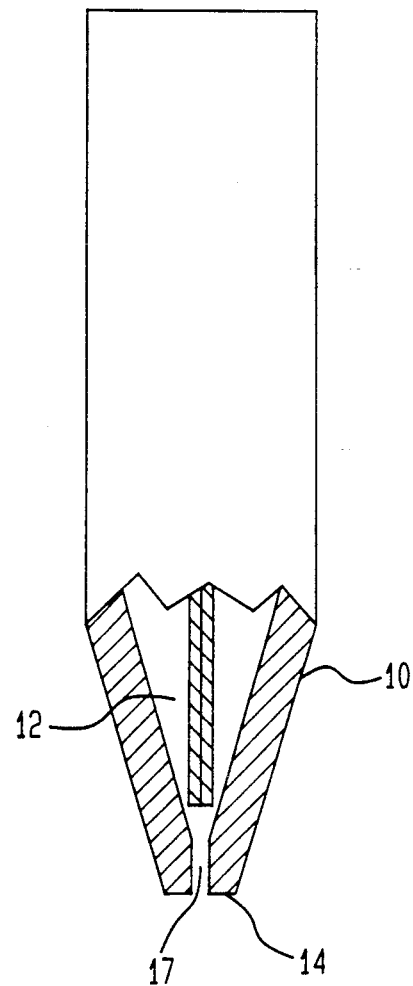
FIGS. 3A-B show a prior art bonding tip.
Figure 3B:
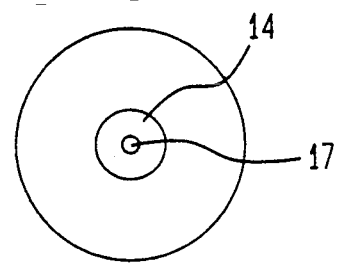
Figure 4A:
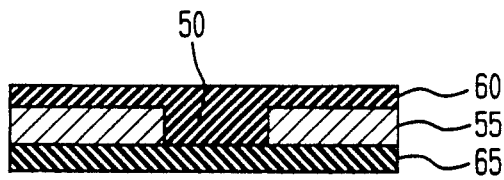
FIGS. 4A-F show process steps for applying a conductive line to a substrate in accordance with the present invention.
Figure 4B:
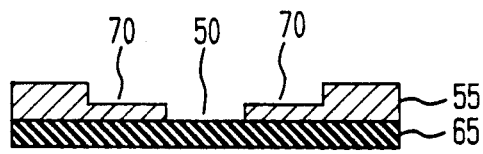

Further, it may be necessary to reduce contact resistance between the conductive line to be applied and the circuit line 55 by "dressing" the site 70 of the circuit line 55 which is adjacent to the area 50. Such contact resistance may be caused by contaminants, such as oxidation, formed on the top surface of the circuit line 55. As shown in FIG. 4B, dressing the site 70 involves reducing the thickness of the site 70 by removing a portion of the top surface of the circuit line 55. The portion of top surface can be removed, for example, using a pulsed excimer laser. As an example, the dressed site 70 is the same width as the conductive line to be applied, and extends at least about 40 microns back from each edge of the area 50. Of course, the dimensions of the site 70 depends on the dimensions of the conductive line being applied.

Moreover, dressing the site 70 may also be required for effectively lowering the amount of protrusion relative to the plane of the circuit line 55 that the conductive line exhibits when applied to the circuit line 55. Thus, the site 70 can be appropriately dressed for effectively meeting strict requirements of surface planarity.

However, it should be appreciated that site dressing is optional, and may be unnecessary if contact resistance and/or surface planarity are not problematic.

Figure 4C:
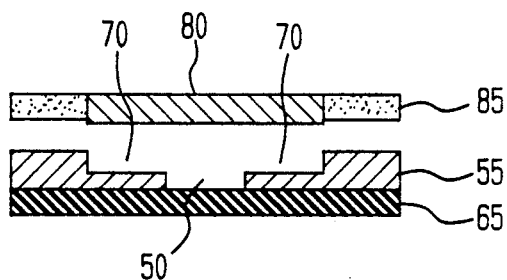
Figure 5:
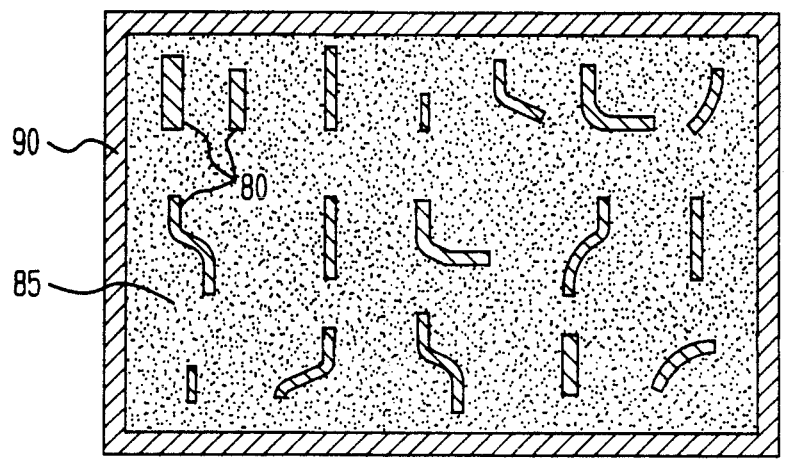
FIG. 5 shows a carrier with conductive lines suspended or embedded therein in accordance with the present invention.
Figure 8A:
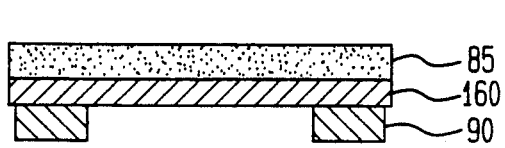
FIGS. 8A-I show process step for fabricating conductive lines suspended or embedded in a carrier in accordance with the present invention.
Figure 8B:
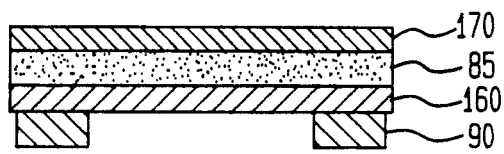
Figure 8C:
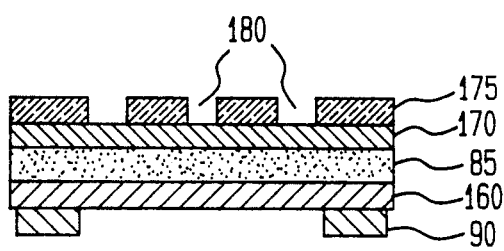
Figure 8D:
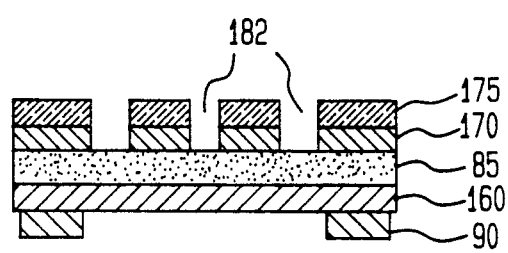
Figure 8E:
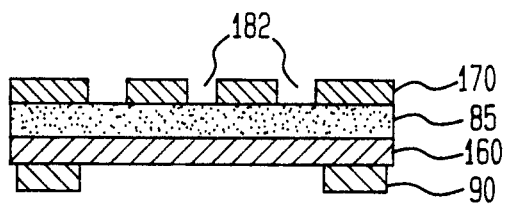
Figure 8F:
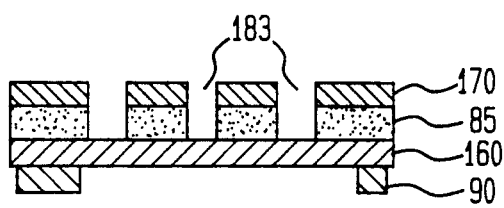
Figure 8G:
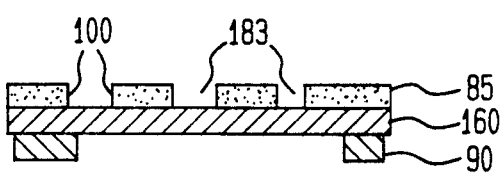
Figure 8H:
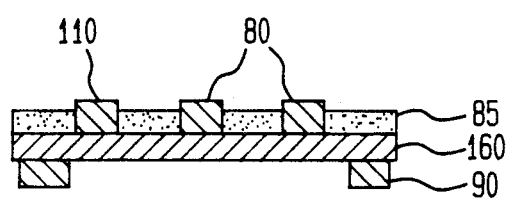
Figure 8I:
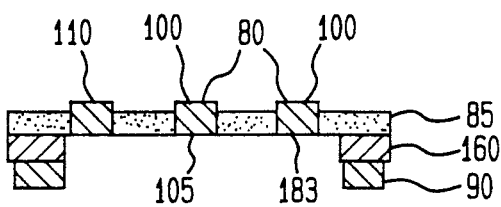

Next, as shown in FIG. 4C, a conductive line 80 is aligned in juxtaposition with the area 50 and the dressed site 70. Referring briefly to FIG. 5, the conductive line 80 may be only one of a plurality of conductive lines 80 suspended or embedded in a grid or carrier 85. Advantageously, for purposes of versatility and flexibility, the conductive lines 80 can be fabricated in the carrier 85 in the form of a plurality of desirable shapes and sizes, thus allowing a user to readily choose the conductive line 80 which best suits his/her needs. For convenience in handling and processing, the carrier 85 is held in a rigid frame 90 comprising, for example, metal. Further, as is better shown in FIG. 8I, the carrier 85 has carrier openings 183 therethrough defined by sidewalls 100; and each carrier opening 183 corresponds to a conductive line 80. The conductive lines 80 are each suspended by the sidewalls 100 of its corresponding carrier opening 183. Each conductive line 80 has an exposed first surface 110 and an exposed second surface 105. The exposed first surface 110 and exposed second surface 105 are opposite each other. As explained in greater detail hereinbelow, the carrier 85 is preferably substantially transparent for alignment purposes. Further, fabrication of the conductive lines 80 in the carrier 85 will also be explained in greater detail hereinbelow.

Referring again to FIG. 4C, alignment of the conductive line 80 in juxtaposition with the area 50 and site 70 can be accomplished by any suitable alignment means. As an example, although not specifically shown herein, alignment can be accomplished by loading the circuit into a bonding station and superimposing the conductive line 80 over the area 50 by attaching the frame 90 to an X-Y-Z positioning arm-stage. Then, using a microscope, the conductive line 80 can be precisely aligned over the area 50 and site 70. Proper alignment is facilitated by the transparency of the carrier 85 which provides the operator with a substantially unobstructed view of the circuit line 55 to which the conductive line 80 is to be bonded.

Figure 4D:
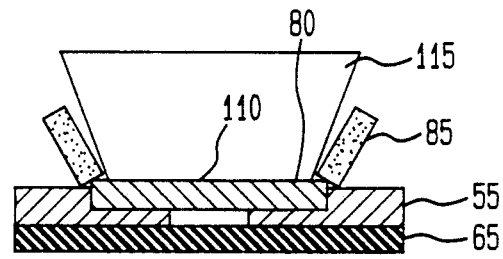
Figure 4E:
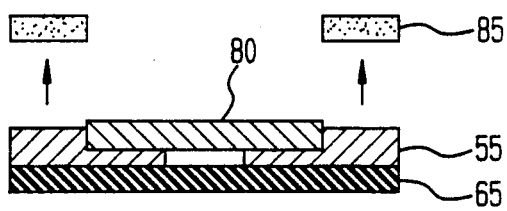

Next, a bonding tip 115 is aligned over the conductive line 80. As shown in FIG. 4D, the bonding tip 115 is applied to one surface, such as the first surface 110, of the conductive line 80 and, preferably, using ultrasonic vibration and laser heating as described in previously mentioned U.S. Pat. No. 4,970,365, to Chalco, the bonding tip 115 is then energized so as to bond the conductive line 80 to the dressed site 70 of the circuit line 55.

Figure 6:
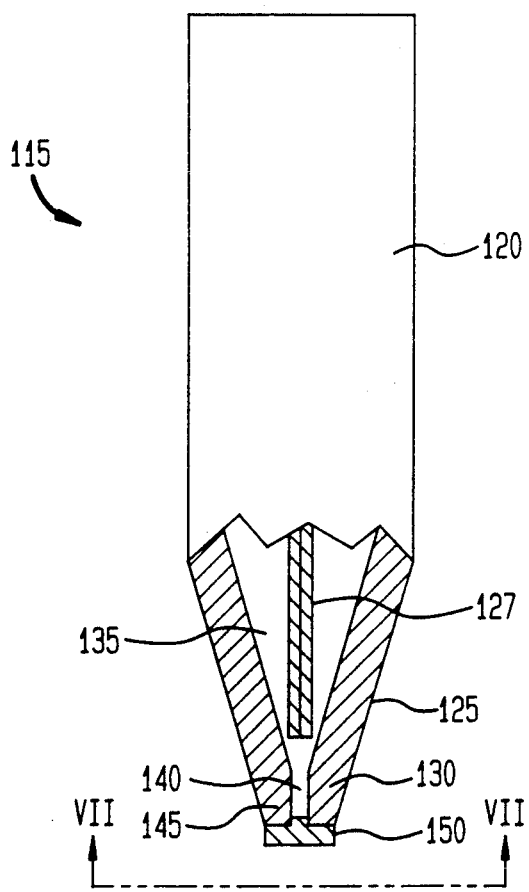
FIG. 6 shows a bonding tip in accordance with the present invention.

More specifically, referring now to FIG. 6, the bonding tip 115 may be pencil-like in shape, and may be comprised of a cylindrical top shank portion 120 and a truncated conical bottom portion 125 which tapers to a bonding or bottom end 130 having a nominal outside diameter of approximately on the order of between 0.003–0.005 inches. The bottom portion 125 of the bonding tip 115 has a conical shaped cavity 135 therein which tapers, for example, at a nominal angle of 20 degrees, to a nominal diameter of approximately 0.001–0.002 inches, and merges with a vertical hole 140. An optical fiber 127 is centrally located in the cylindrical top shank portion 120 and truncated conical bottom portion 125.

In a preferred embodiment, the vertical hole 140 is approximately 0.001–0.002 inches nominal in diameter and 0.003–0.005 inches nominal in length. The nominal thickness of the wall 145 defining the vertical hole 140 is an important dimension since this is the primary area that will be heated during bonding. Accordingly, the wall 145 defining the vertical hole 140 should have minimal thickness so as to further the heating thereof. In a preferred embodiment, the thickness of the wall 145 varies from approximately 0.001 inches at the bottom portion of the vertical hole 140 to approximately 0.004 inches at the top portion of the vertical hole 140.

In order to prevent energy loss from the bottom end 130 of the bonding tip 115 and to create a highly-efficient laser-beam trap, a capping layer 150 is included to provide a seal thereat. The capping layer 150 preferably covers the entire footprint of the bottom end 130 of the bonding tip 115, and can be integrally attached to or deposited on the bottom end 130 by any suitable means. For instance, the capping layer 150 can be attached using plating techniques, or deposited using chemical vapor deposition, plating.

Figure 7:
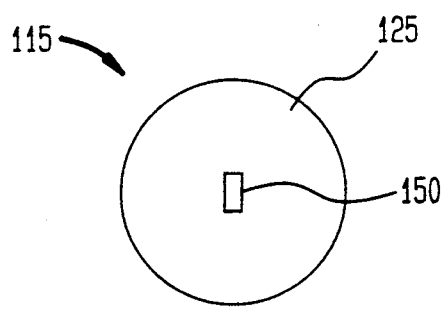
FIG. 7 shows a front view of the bonding tip of FIG. 6.

During bonding, the bonding tip 115 or, more specifically, the capping layer 150 of the bonding tip 115, may substantially completely cover and press the conductive line 80 to form a bond. While bonding, the bonding tip 115 should avoid excessive contact and heating of the carrier 85 on which the conductive line 80 is located. Such excessive contact and heating may result in inefficient and ineffective bonding, and may also result in damage to the carrier 85. In this regard, the carrier 85 is typically comprised of relatively fragile material, such as polymer, and thus excessive heating with the bonding tip 115 during bonding may cause unwanted softening thereof. Further, for convenience, manufacturability and cost effectiveness considerations, the capping layer 150 should also be adequately dimensioned for proper bonding of conductive lines of various shapes and sizes. By way of example, a rectangular shaped capping layer 150, as shown in FIG. 7, having a nominal width of about 80 microns and a nominal length of about 120 microns has been found adequate for properly bonding conductive lines having a nominal width of between 20 microns and 40 microns and a nominal length of up to about 120 microns.

Further, although not shown, if the length of the desired area requires a conductive line which is substantially longer than the length of the capping layer 150 of the bonding tip 115, such a conductive line can still be applied over such an area by first bonding one end of the conductive line to one end of the circuit line, and then subsequently bonding the other end of the conductive line to the other end of the circuit line. In other words, it is not necessary for the capping layer 150 to substantially, completely cover the entire conductive line so as to complete the bond in one bonding step.

Moreover, the capping layer 150 should have a thickness which allows for simplified heating thereof. For example, a capping layer having a nominal thickness of 5 microns to 10 microns has been found to be adequate. However, it should be fully understood by those skilled in the art that other dimensions for the capping layer 150 may be suitable for achieving adequate bonds.

Furthermore, excessive heating of the circuit base 65 on which the circuit line 55 is located should also be avoided during bonding. Similar to the carrier 85, the circuit base 65 is also typically comprised of relatively fragile material, such as polymer, which will undesirably soften under excessive heat conditions. Advantageously, the present invention provides for controllable and reproducible bonding conditions for forming bonds to avoid or minimize such occurrences.

Figure 4F:
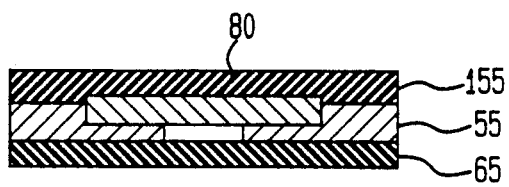

Preferably, the capping layer 150 should comprise material which is resistant to wear and oxidation under the heating temperatures required for bonding, for example, typically in the range of 300–500 degrees Celcius. For ease of fabrication, the capping layer 150 can comprise the same or similar material as that used for construction of the bonding tip 115, and fabrication can be achieved using chemical vapor deposition. Suitable material for constructing the capping layer 150 include stainless steels, nickel-based alloys, tungsten, tungsten alloys, or the like. Referring now FIG. 4E, subsequent to bonding of the conductive line 80 to the circuit line 55, the carrier 85 in which the conductive line 80 is suspended is lifted so as to detach the conductive line 80 therefrom. In order to prevent or minimize damage to the conductive line 80, damage to the circuit line 55, and weakening or fracturing of the bond between the conductive line 80 and the circuit line 55, the amount of force required for detaching the conductive line 80 from the carrier 85 should be minimal. In this regard, the manner in which the conductive line 80 is suspended in the carrier 85 is important. Fabrication of the conductive line 80 so as to minimize the amount of force required for detachment from the carrier 85 is explained in detail hereinbelow. Subsequent to detachment, the exposed circuit line 55 and conductive line 80 may be covered with a suitable insulating material 155, such as polyimide, as shown in FIG. 4F. For instance, the purpose of the insulating material 155 may be required for passivating thin-film circuitry or for initiating the next thin-film layer.

Reference is now made to FIGS. 8A–I which show process steps for fabrication of the conductive lines 80 suspended in the carrier 85. A support layer 160 has a carrier layer 85 disposed thereon. The support layer 160 can comprise any suitable material which has adequate rigidity for providing necessary support and proper etch selectivity to the conductive lines and the carrier layer 85 for allowing subsequent removal thereof. As an example, the support layer 160 can comprise copper. The carrier layer 85 should comprise material which allows the conductive lines 80 to be suspended or embedded therein and, for the reasons stated hereinabove, which also allows for the conductive lines to be detached therefrom with a minimal amount of force. Further, the carrier layer 85 can preferably be made to be sufficiently transparent, such as, by thinning, so that the integrated circuit on which a conductive line 80 is to be applied can be viewed through the carrier layer 85 so as to allow for proper alignment of the conductive line 80. For example, the carrier layer 85 can comprise a polymer, such as, polyimide. Illustratively, the carrier layer 85 can be formed on the support layer 160 using conventional techniques of spin-coating or laminating. As shown, the support layer 160 and carrier layer 85 can be positioned on a frame 90 to facilitate processing.

Next, a mask layer 170 is formed over the carrier layer 85, such as by blanket deposition. The mask layer 170 can comprise any suitable masking material, such as, aluminum. A photoresist layer 175 is then applied over the mask layer 170. The photoresist layer 175 is conventionally exposed and developed to form one or more openings 180 in the photoresist layer 175. The openings 180 are configured in accordance with the requirements of the patterns of the conductive lines being formed. In other words, each of the openings 180 has a pattern, linear or non-linear, which matches the pattern of a conductive line to be formed. The mask layer 170 is then etched by conventional techniques, such as by chemical etching, through the openings 180 in the photoresist layer 175 so as to form corresponding openings 182 through the mask layer 170. The photoresist layer 175 is subsequently removed. The carrier layer 85 is then etched also using conventional techniques, such as reactive-ion-etching or laser ablation, through the openings 182 in the mask layer 170 so as to form corresponding openings 183 in the carrier layer 85. The cross-section of these openings 183 can be tailored for specific applications, for instance, the walls of the openings 183 can range from a vertical profile to a tapered profile. The mask layer 170 is then removed, for example, using a conventional chemical etching technique.

However, those skilled in the art will realize that such masking may not be required for forming the carrier layer openings 183. For instance, laser ablation can be used in lieu of the mask.

Optionally, the carrier layer 85 can then be thinned to a desired thickness which corresponds to the thickness of the conductive lines being formed, for example, between 1 micron and 10 microns; or the carrier layer 85 can be made thinner than the thickness of the conductive lines being formed. Such thinning increases the transparency of the carrier layer 85. Thus, the amount of thinning, if any, depends on the degree of transparency desired for the carrier layer 85. Thinning can be accomplished, for example, using conventional techniques of reactive-ion-etching. In another embodiment, the step of thinning the carrier layer 85 is performed prior to deposition of the mask layer 170.

The openings 180 in the carrier layer 85 are then filled with suitable conductive material, such that the conductive material appropriately, snugly fits, such as at least partially by friction fit, against the sidewalls 100 of the openings 180 so as to be suspended by the sidewalls 100, for forming the conductive lines 80. Note that the conductive lines 80 each have an exposed first surface 110. Filling can be accomplished by any appropriate technique, and the conductive material can comprise any appropriate material which will not readily react with and/or adhere to the carrier layer 85. In this regard, the conductive lines 80 should each be suspended and embedded within its respective opening 180, but should also be readily and easily detachable therefrom. In other words, the amount of force required to detach the conductive material from the opening 180 of the carrier layer 85 should be minimal. For instance, gold can be plated, such as by electroplating, to the support layer 160 through the openings 180; advantageously, gold will react and adhere minimally with a polymer carrier layer. Further, the thickness or height of the conductive lines is controllable by regulating the amount of gold electroplated to the support layer 160. More specifically, the thickness or height of the conductive lines 80 will increase as more gold is electroplated to the support layer 160. The conductive lines 80 can be made to be higher than the carrier layer 85 by electroplating an appropriate amount of gold to the support layer 160; and thus the thickness or height of the conductive lines 80 is not limited by the thickness or height of the carrier layer 85.

Finally, the support layer 160 is removed, such as by chemical etching, so that the conductive lines 80 are left suspended by and embedded in the carrier layer 85. The conductive lines 80 will not detach from the carrier layer 85 without adequate external forces inducing such detachment. Note that after the support layer 160 is removed, the conductive lines 80 each have an exposed second surface 105 which is opposite the exposed first surface 110. Further, the exposed second surface 105 is substantially coplanar with the bottom surface of the carrier 85.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of applying a conductive line to a substrate, comprising the steps of:
    aligning a conductive line in juxtaposition with a selected area of a substrate, said conductive line being suspended in a carrier having a carrier opening therethrough, said carrier opening being defined by sidewalls, and said conductive line being suspended by said sidewalls of said carrier opening;
    bonding said conductive line to said selected area of said substrate; and
    detaching said conductive line from said carrier.

2. A method of applying a conductive line to a substrate according to claim 1, wherein said selected area is an open circuit defect.

3. A method of applying, a conductive line to a substrate according to claim 1, wherein said step of bonding comprises heating said conductive line.

4. A method of applying a conductive line to a substrate according to claim 3, wherein said heating is accomplished using a bonding tip.

5. A method of applying a conductive line to a substrate according to claim 4, wherein said bonding tip is energized with ultrasonic vibration and laser energy.

6. A method of applying a conductive line to a substrate according to claim 4, wherein said bonding tip has a bonding end which is conical shaped.

7. A method of applying a conductive line to a substrate according to claim 6, wherein said bonding end has a capping layer for sealing said bonding end.

8. A method of applying, a conductive line to a substrate according to claim 7, wherein said capping layer is flat.

9. A method of applying a conductive line to a substrate according to claim 7, wherein said capping layer covers the entire footprint of said bonding end.

10. A method of applying a conductive line to a substrate according to claim 1, wherein said carrier is transparent.

11. A method of applying a conductive line to a substrate according to claim 1, wherein said carrier comprises a polymer.

12. A method of applying a conductive line to a substrate according to claim 11, wherein said polymer comprises polyimide.

13. A method of applying a conductive line to a substrate according to claim 1, wherein said conductive line is between 1 micron and 10 microns thick.

14. A method of applying a conductive line to a substrate according to claim 1, wherein said step of detaching comprises using a minimal amount of force.

15. A method of repairing an open circuit defect, comprising the steps of:
    aligning a repair line in juxtaposition with an open circuit defect of a circuit line, said repair line being suspended in a carrier having a carrier opening therethrough, said carrier opening being defined by sidewalls, and said repair line being suspended by the sidewalls of said carrier opening;
    bonding said repair line to said circuit line over said open circuit defect; and
    detaching said repair line from said carrier.

16. A method of repairing an open circuit defect according to claim 15, wherein said step of bonding comprises heating said repair line.

17. A method of repairing an open circuit defect according to claim 16, wherein said heating is accomplished using a bonding tip.

18. A method of repairing an open circuit defect according to claim 17, wherein said bonding tip is energized with ultrasonic vibration and laser energy.

19. A method of repairing an open circuit defect according to claim 16, wherein said bonding tip has a bonding end which is conical shaped.

20. A method of repairing an open circuit defect according to claim 19, wherein said bonding end has a capping layer for sealing said bonding end.

21. A method of repairing an open circuit defect according to claim 20, wherein said capping layer is flat.

22. A method of repairing an open circuit defect according to claim 20, wherein said capping layer covers the entire footprint of said bonding end.

23. A method of re an open circuit defect according to claim 15, wherein said carrier is transparent.

24. A method of repairing an open circuit defect according to claim 15, wherein said carrier comprises a polymer.

25. A method of repairing an open circuit defect according to claim 24, wherein said polymer comprises polyimide.

26. A method of repairing an open circuit defect according to claim 15, wherein said conductive line is between 1 micron and 10 microns thick.

27. A method of repairing an open circuit defect according to claim 15, wherein said step of detaching comprises using a minimal amount of force.

* * * * *